US007295022B2

(12) United States Patent
Hillard et al.

(10) Patent No.: US 7,295,022 B2
(45) Date of Patent: Nov. 13, 2007

(54) METHOD AND SYSTEM FOR AUTOMATICALLY DETERMINING ELECTRICAL PROPERTIES OF A SEMICONDUCTOR WAFER OR SAMPLE

(75) Inventors: Robert J. Hillard, Avalon, PA (US); Louison Tan, Pittsburgh, PA (US)

(73) Assignee: Solid State Measurements, Inc., Pittsburgh, PA (US)

( * ) Notice: Subject to any disclaimer, the term of this patent is extended or adjusted under 35 U.S.C. 154(b) by 142 days.

(21) Appl. No.: 11/216,505

(22) Filed: Aug. 31, 2005

(65) Prior Publication Data

US 2007/0046310 A1    Mar. 1, 2007

(51) Int. Cl.
*G01R 31/02*        (2006.01)
(52) U.S. Cl. ....................................... 324/754
(58) Field of Classification Search .............. 324/765, 324/754, 158.1, 761, 750, 662, 671, 537; 438/14–18; 257/78
See application file for complete search history.

(56) References Cited

U.S. PATENT DOCUMENTS 5,491,421 A * 2/1996 Katsuie .................. 324/452
6,972,582 B2 * 12/2005 Howland et al. ........... 324/761
6,995,574 B2 * 2/2006 Sergoyan et al. .......... 324/662

OTHER PUBLICATIONS

Martin A. Green; "Intrinsic Concentration, Effective Densities Of States, And Effective Mass In Silicon"; J. Appl. Phys. 67 (6), Mar. 15, 1990; pp. 2944-2954.

Jordi Sune, Piero Olivo and Bruno Ricco; "Quantum-Mechanical Modeling Of Accumulation Layers In MOS Structure"; IEEE Transactions On Electron Devices, vol. 39, No. 7, Jul. 1992; 8 pages.

Letter, "Extension Of The McNutt-Sah Method For Measuring Thin Oxide Thickness Of MOS Devices"; Solid State Electronics, vol. 42, No. 4, pp. 671-673; (1998).

"Standard Test Method For Determining Net Carrier Density Profiles In Silicon Wafers By Capacitance-Voltage Measurements With A Mercury Probe"; ASTM Designation: F. 1392-00; pp. 390-401 (2000).

* cited by examiner

*Primary Examiner*—Minh N. Tang
*Assistant Examiner*—Tung X. Nguyen
(74) *Attorney, Agent, or Firm*—The Webb Law Firm (57) ABSTRACT

In a method and apparatus for determining one or more electrical properties of a semiconductor wafer or sample, the response of a semiconductor wafer or sample to an applied CV-type electrical stimulus is measured. Utilizing a recursive technique, progressively more accurate values of equivalent oxide thickness CET, maximum capacitance Cox, flatband voltage Vfb and other properties of the semiconductor wafer or sample are determined from the measured response. An equivalent oxide thickness EOT of the semiconductor wafer or sample can be determined as a function of the most accurate value of CET determined based upon convergence of at least one of (1) the last two values of Cox or (2) the last two values of Vfb within a predetermined convergence criteria. One or more of the EOT value and/or values of one or more of CET, Cox or Vfb can then be output in a human detectable form.

16 Claims, 6 Drawing Sheets

* Subroutine A determines a value for $Nsurf_i$ (bulk surface carrier concentration).

** When the ($Vfb_i$, $Cfb_i$) data point is one of the sampled data points of the CV Curve, extract the value of $Vfb_i$ corresponding to $Cfb_i$ directly. Otherwise, use suitable interpolation technique to obtain value of $Vfb_i$ corresponding to $Cfb_i$ from the CV Curve.

Fig. 4

METHOD AND SYSTEM FOR AUTOMATICALLY DETERMINING ELECTRICAL PROPERTIES OF A SEMICONDUCTOR WAFER OR SAMPLE

BACKGROUND OF THE INVENTION

1. Field of the Invention

The present invention relates to testing of semiconductor wafers or samples and, more particularly, to accurately determining one or more properties of a semiconductor wafer or a semiconductor sample.

2. Description of Related Art

Heretofore, determination of a maximum capacitance, a.k.a. oxide capacitance (Cox), and flatband voltage (Vfb) of a semiconductor wafer or sample under test was accomplished utilizing a guided heuristic technique. Specifically, an operator determines a flatband capacitance Cfb of the semiconductor wafer or sample under test from a CV curve obtained or derived from the response of the semiconductor wafer or sample to a CV-type electrical stimulus applied by the operator to the semiconductor wafer or sample under test. An exemplary CV-type electrical stimulus includes sweeping a DC voltage, having an AC voltage superimposed thereon, from a starting voltage to an ending voltage. During the sweep of the DC voltage, plural samples of the DC voltage and the corresponding capacitance, i.e., voltage-capacitance data points, are acquired. The CV curve is derived or defined from these data points.

Utilizing the CV curve, the operator determines the flatband voltage Vfb corresponding to the flatband capacitance Cfb obtained from the CV curve. The operator then combines Vfb with an empirically determined overdrive voltage (Voverdrive). For a p-type wafer Voverdrive is subtracted from Vfb. For an n-type wafer Voverdrive is added to Vfb.

If the combination of Vfb and Voverdrive equals the starting voltage of the CV-type electrical stimulus, the estimated value of Vfb and the capacitance value on the CV curve corresponding to said starting voltage are deemed to be the actual values of Vfb and Cox for the semiconductor wafer or sample under test. However, if the combination does not equal said starting voltage, the operator obtains or derives a new CV curve from a new CV-type electrical stimulus applied by the operator to the semiconductor wafer or sample under test. For this new CV-type electrical stimulus, however, the operator utilizes a different starting voltage. The operator then utilizes this new CV curve in the manner described above to determine if the combination of the new value of Vfb and Voverdrive equals the starting voltage of the new CV-type electrical stimulus. If not, the foregoing process of obtaining or deriving a new CV curve based on the response of the semiconductor wafer or sample under test to a new CV-type electrical stimulus, determining values of flatband capacitance Cfb and flatband voltage Vfb from the new CV curve and determining if the combination of Vfb and Voverdrive equals the starting voltage of the CV curve is repeated until said combination for a particular CV curve equals the starting voltage of the corresponding CV-type electrical stimulus whereupon the estimated value of Vfb and the capacitance value corresponding to said starting voltage are deemed to be the actual values of Vfb and Cox for the semiconductor wafer or sample under test.

Once the values of Vfb and Cox for the semiconductor wafer or sample under test have been determined, values of capacitive equivalent thickness (CET), equivalent oxide thickness (EOT) and other properties of the semiconductor wafer or sample under test can be determined.

It has been observed that an experienced operator can use the results in one iteration of the foregoing heuristic technique to guide the choice of the starting voltage for the next application of a CV-type electrical stimulus to the semiconductor wafer or sample under test. Notwithstanding, the prior art heuristic technique for determining values of Vfb and Cox of a semiconductor wafer or sample under test typically requires the use of a plurality of CV curves each obtained or derived from a unique CV-type electrical stimulus having a different starting voltage.

What is needed, however, and is not heretofore known, is a method and apparatus for determining the values of Cfb and Vfb of a semiconductor wafer or sample under test, wherefrom other properties of the semiconductor wafer or sample under test can be determined, more quickly than the prior art heuristic technique, with minimal operator intervention and with minimal application of CV-type electrical stimulus to the semiconductor wafer or sample under test.

SUMMARY OF THE INVENTION

The invention is a method of determining one or more electrical properties of a semiconductor wafer or sample. The method includes (a) applying a capacitance-voltage (CV) type electrical stimulus to a semiconductor wafer or sample having a dielectric layer overlaying a substrate of semiconducting material; (b) measuring a response of the semiconductor wafer or sample to the CV-type stimulus; (c) setting i=1; (d) determining from the measured response in step (b) a maximum capacitance $Cox_i$ of the semiconductor wafer or sample and a minimum capacitance Cmin of the semiconductor wafer or sample; (e) determining a flatband capacitance $Cfb_i$ of the semiconductor wafer or sample as a function of $Cox_i$ and Cmin; (f) utilizing the measured response in step (b) to determine for $Cfb_i$ a corresponding flatband voltage $Vfb_i$ of the semiconductor wafer or sample; (g) combining $Vfb_i$ and a predetermined overdrive voltage Voverdrive to obtain a starting voltage value Vstart; (h) setting i=i+1; (i) determining from the measured response in step (b) a maximum capacitance $Cox_i$ of the semiconductor wafer or sample corresponding to the value of Vstart; and (j) repeating steps (e)-(i) until (1) a predetermined capacitance convergence criteria for $Cox_i$ and $Cox_{i-1}$ is satisfied; and/or (2) a predetermined flatband voltage convergence criteria for $Vfb_i$ and $Vfb_{i-1}$ is satisfied.

The method can also include determining for each value of i a capacitive equivalent thickness $CET_i$ of the semiconductor wafer or sample as a function of $Cox_i$ and, when at least one of the predetermined capacitance convergence criteria or the predetermined flatband voltage convergence criteria is satisfied, determining an equivalent oxide thickness EOT of the semiconductor wafer or sample as a function of Voverdrive and $CET_i$ for the current value of i.

The method can also include outputting one or more values of Cox, Vfb, CET and EOT in a human detectable or perceivable manner.

The invention is also a method of determining one or more electrical properties of a semiconductor wafer or sample that comprises (a) applying a CV-type stimulus to a semiconductor wafer or sample comprised of a substrate of semiconducting material having an overlaying dielectric layer; (b) measuring a response of the semiconductor wafer or sample to the CV-type stimulus; (c) determining a maximum capacitance value Cox1 of the semiconductor wafer or sample and a minimum capacitance value Cmin of the semiconductor wafer or sample from the measured response in step (b); (d) determining a flatband capacitance value Cfb1 of the semiconductor wafer or sample as a function of Cox1 and Cmin; (e) utilizing the measured response in step (b) to determine for Cfb1 a corresponding flatband voltage value Cfb1 of the semiconductor wafer or sample; (f) combining Cfb1 and a predetermined overdrive voltage value Voverdrive to obtain a starting voltage value Vstart; (g) utilizing the value of Vstart to determine a second maximum capacitance value Cox2 of the semiconductor wafer or sample from the measured response in step (b); (h) determining a flatband capacitance value Cfb2 of the semiconductor wafer or sample as a function of Cox2 and Cmin; (i) utilizing the measured response in step (b) to determine for Cfb2 a corresponding flatband voltage value Cfb2 of the semiconductor wafer or sample; and (j) determining an equivalent oxide thickness (EOT) of the semiconductor wafer or sample when at least one of (1) a predetermined capacitance convergence criteria for Cox1 and Cox2 is satisfied and/or (2) a predetermined flatband voltage convergence criteria for Cfb1 and Cfb2 is satisfied.

The method can also include determining a capacitive equivalent thickness CET of the semiconductor wafer or sample as a function of Cox1 or Cox2 and determining EOT in step (j) as a function of CET and Voverdrive.

The method can also include outputting at least one of CET or EOT in a human detectable or perceivable manner.

The invention is also a method of determining one or more electrical properties of a semiconductor wafer or sample that includes (a) applying a CV-type stimulus to a semiconductor wafer or sample comprised of a substrate of semiconducting material having an overlaying dielectric layer; (b) measuring a response of the semiconductor wafer or sample to the CV-type stimulus; (c) setting i=1; (d) determining from the measured response in step (b) a maximum capacitance $Cox_i$ of the semiconductor wafer or sample and a minimum capacitance Cmin of the semiconductor wafer or sample; (e) determining a flatband capacitance $Cfb_i$ of the semiconductor wafer or sample as a function of $Cox_i$; (f) obtaining from the measured response in step (b) a flatband voltage $Vfb_i$ of the semiconductor wafer or sample corresponding to $Cfb_i$; (g) combining a predetermined voltage Voverdrive and $Vfb_i$ to obtain a starting voltage value Vstart; (h) obtaining from the measured response in step (b) a maximum capacitance $Cox_{i+1}$ of the semiconductor wafer or sample corresponding to the current value of Vstart; (i) determining a flatband capacitance $Cfb_{i+1}$ of the semiconductor wafer or sample as a function of $Cox_{i+1}$; (j) obtaining from the measured response in step (b) a flatband voltage value $Vfb_{i+1}$ of the semiconductor wafer or sample corresponding to $Cfb_{i+1}$; and (k) when a predetermined convergence criteria for at least one of (1) $Vfb_i$ and $Vfb_{i+1}$ or (2) $Cox_i$ and $Cox_{i+1}$ is satisfied, determining an equivalent oxide thickness (EOT) of the semiconductor wafer or sample, otherwise, setting i=i+1 and repeating steps (g)-(k).

The predetermined convergence criteria for $Vfb_i$ and $Vfb_{i+1}$ can be $\{[(Vfb_{i+1}-Vfb_i) \div Vfb_i]*100\} \leq x\ \%$, where $x\ \%$ can equal 1%.

The predetermined convergence criteria for $Cox_i$ and $Cox_{i+1}$ can be $\{[(Cox_{i+1}-Cox_i) \div Cox_i]*100\} \leq x\ \%$, where $x\ \%$ can equal 1%.

The method can also include: determining as a function of each value of Cox corresponding values of (1) capacitive oxide thickness (CET) of the semiconductor wafer or sample and (2) capacitance of a space charge region (Csc) of the semiconductor wafer or sample in inversion; determining as a function of each value of Csc a corresponding value of bulk surface carrier concentration (Nsurf) of the semiconductor wafer or sample; and determining as a function of each value of Nsurf a corresponding value of intrinsic Debye length (Ld) of the semiconductor wafer or sample. Each value of flatband capacitance Cfb can also be determined as a function of the corresponding value of Ld.

In step (k), EOT can be determined as a function of the value of Voverdrive and the latest value of CET.

Lastly, the invention is a system for determining one or more electrical properties of a semiconductor wafer or sample. The system includes means for measuring a response of a semiconductor wafer or sample to an applied CV-type electrical stimulus; means for iteratively determining more accurate values of equivalent oxide thickness CET, maximum capacitance Cox and flatband voltage Vfb of the semiconductor wafer or sample as a function of the measured response; means for determining a value of equivalent oxide thickness EOT of the semiconductor wafer or sample as a function of the most accurate value of CET determined based upon convergence of at least one of (1) the last two values of Cox or (2) the last two values of Vfb to within a predetermined convergence criteria; and means for outputting in human detectable or perceivable form at least one of the EOT value, the most accurate value of CET, the most accurate value of Cox and/or the most accurate value of Vfb.

DETAILED DESCRIPTION OF THE INVENTION

The present invention will be described with reference to the accompanying figures, where like reference numbers correspond to like elements.

Figure 1:
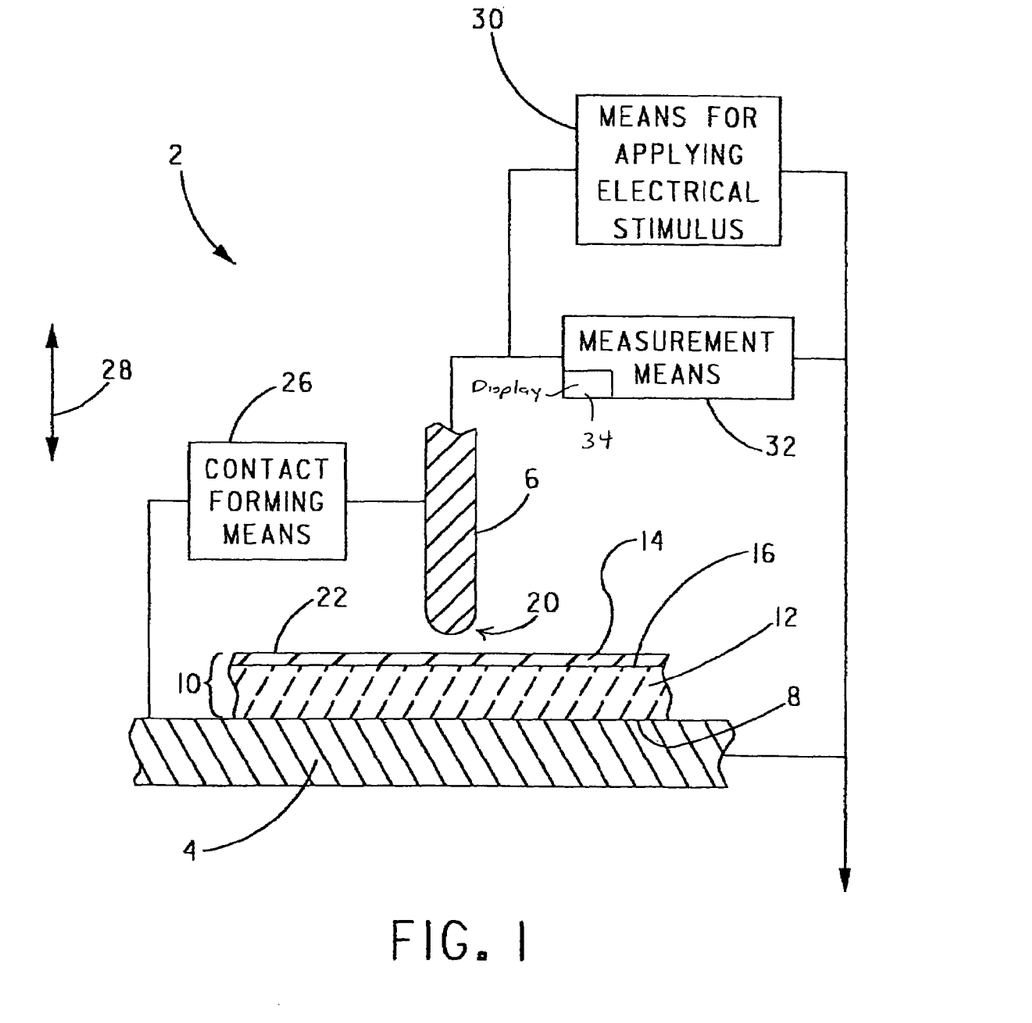
FIG. 1 is a combined block diagram and cross-sectional view of an exemplary semiconductor wafer or sample test system.

With reference to FIG. 1, a semiconductor wafer or sample test system 2 includes an electrically conductive vacuum chuck 4 and a contact 6. The illustration of contact 6 in the form of an elongated probe is not to be construed as limiting the invention since it is envisioned that contact 6 can have any shape or form suitable for testing a semiconductor wafer or sample under test. Chuck 4 is configured to support a backside 8 of a semiconductor wafer or sample 10 under test which includes a substrate 12 formed of semiconducting material which is held in contact with chuck 4 by means of a vacuum (not shown). As would be appreciated by one skilled in the art of semiconductor wafer or sample processing and testing, substrate 12 of semiconductor wafer or sample 10 can be formed of any suitable semiconducting material known in the art, such as, without limitation, silicon (Si), germanium (Ge), gallium arsenede (GaAs), and the like. Desirably, semiconductor wafer or sample 10 includes a dielectric or oxide layer 14 overlaying a topside 16 of substrate 12.

Contact 6 can have at least a partially spherical and conductive surface 20 for contacting a topside 16 of substrate 12 or a topside 22 of dielectric layer 14 when present. While a partially spherical conductive surface 20 is desired, it is envisioned that surfaces (not shown) having other shapes suitable for testing a semiconductor wafer or sample 10 can be utilized. Accordingly, the illustration in FIG. 1 of conductive surface 20 being partially spherical is not to be construed as limiting the invention.

A contact forming means 26, of the type well-known in the art, controls the vertical movement of chuck 4 and/or contact 6, in one or both of the directions shown by arrow 28, to move contact 6 and semiconductor wafer or sample 10 into contact whereupon contact 6 is pressed into contact with topside 16 of substrate 12 or topside 22 of dielectric layer 14 when present.

A means for applying electrical stimulus 30 can be electrically connected to apply a suitable electrical stimulus to contact 6 and semiconductor wafer or sample 10 when it is received on chuck 4 and contact 6 is in contact with topside 16 of substrate 12 or topside 22 of dielectric layer 14 when present.

A measurement means 32 can be electrically connected for measuring the response of semiconductor wafer or sample 10 to the test stimulus applied by the means for applying electrical stimulus 30 and for processing the measured response in any suitable and desirable manner. A display 34 or any other suitable output means can also be provided to enable measurement means 32 to output in a human perceivable manner the results of any processing performed by measurement means 32 on the measured response of semiconductor wafer or sample 10. Desirably, chuck 4 is connected to a reference ground. However, this is not to be construed as limiting the invention since chuck 4 alternatively can be connected to an AC or DC reference bias.

The present invention will now be described with reference to semiconductor wafer or sample 10 having dielectric layer 14 overlaying substrate 12. However, this is not to be construed as limiting the invention.

Figure 2:
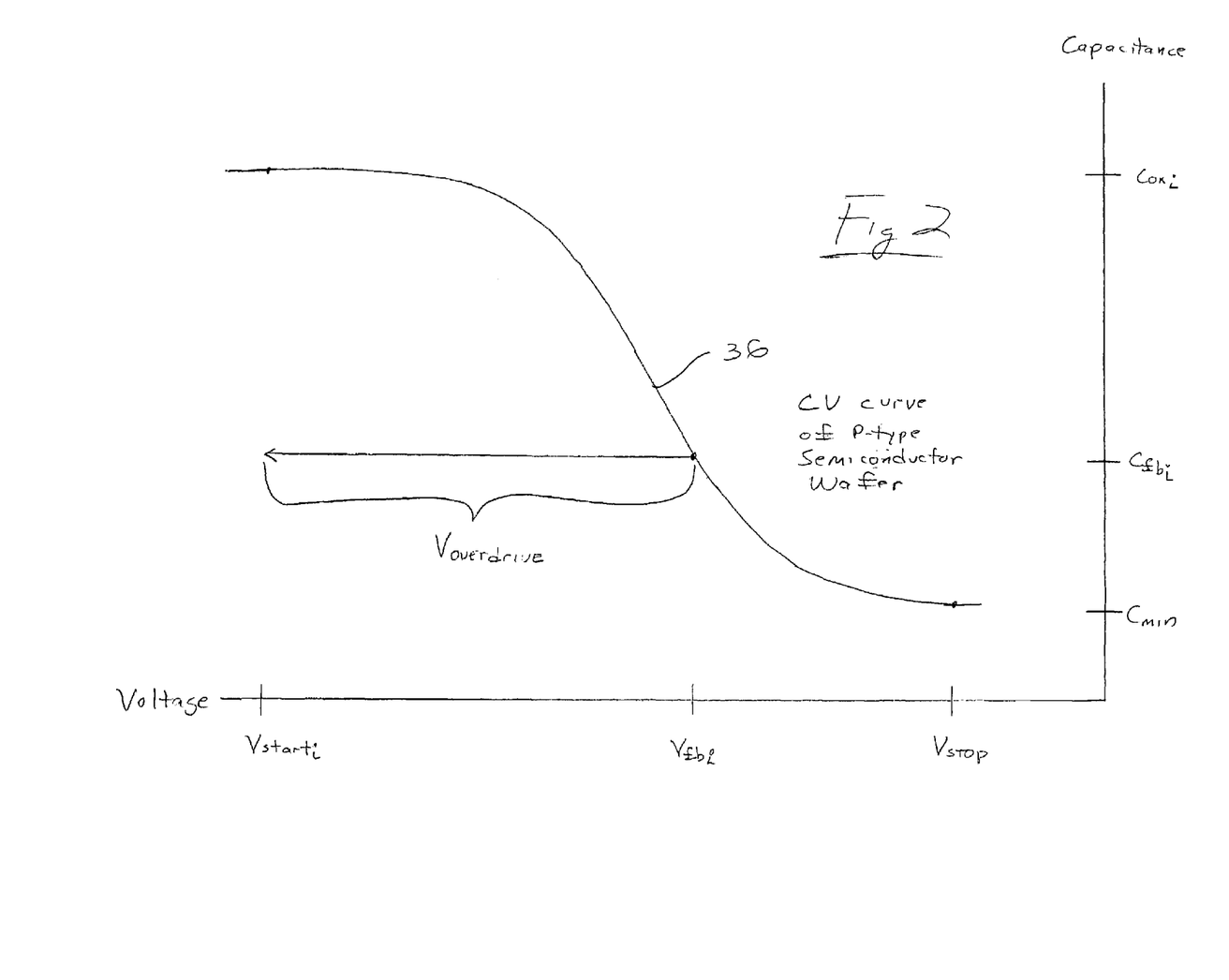
FIG. 2 is an exemplary CV curve for a p-type semiconductor wafer or sample obtained by the test system shown in FIG. 1.

With reference to FIG. 2 and with continuing reference to FIG. 1, means for applying electrical stimulus 30 can apply a CV-type electrical stimulus to contact 6 and semiconductor wafer or sample 10 when it is received on chuck 4 and contact 6 is in contact with topside 22 of dielectric layer 14. An exemplary CV-type electrical stimulus includes sweeping a DC voltage, having an AC voltage superimposed thereon, from a starting voltage (Vstart) to an ending voltage (Vstop) and measuring the DC voltage and the corresponding capacitance (C) during the sweep. More specifically, measurement means 32 samples a plurality of discrete DC voltage-capacitance data points during the sweep of the DC voltage from Vstart to Vstop and stores these data points in a memory (not shown) of measurement means 32. An exemplary CV curve 36 derived or defined from voltage-capacitance data points acquired by measurements means 32 during the application of an exemplary CV-type electrical stimulus to a p-type semiconductor wafer or sample is shown in FIG. 2.

CV curve 36 is provided solely for the purpose of describing the present invention. Thus, the illustration of CV curve 36, including its shape and the location of Vstart, Vstop, and the like, are not to be construed in any manner as limiting the invention. Since a CV curve for an n-type semiconductor wafer or sample would be the mirror image of CV curve 36, a CV curve for an n-type semiconductor wafer or sample is not included herein to avoid unnecessary redundancy. Accordingly, while the present invention will be described with reference to CV curve 36 obtained for a p-type semiconductor wafer or sample, it is to be appreciated that the present invention is also applicable to a CV curve 36 obtained for an n-type semiconductor wafer or sample.

The thus derived or defined CV curve 36 can be utilized to determine other electrical properties of semiconductor wafer or sample 10, such as, without limitation: equivalent oxide thickness (EOT); maximum capacitance (Cox); flatband voltage (Vfb); flatband capacitance (Cfb); bulk surface carrier concentration (Nsurf); and the like. A method by which measurement means 32 determines these electrical properties in accordance with the present invention will now be described with reference to FIGS. 3A, 3B and 3C and with continuing reference to FIGS. 1 and 2.

Figure 3A:
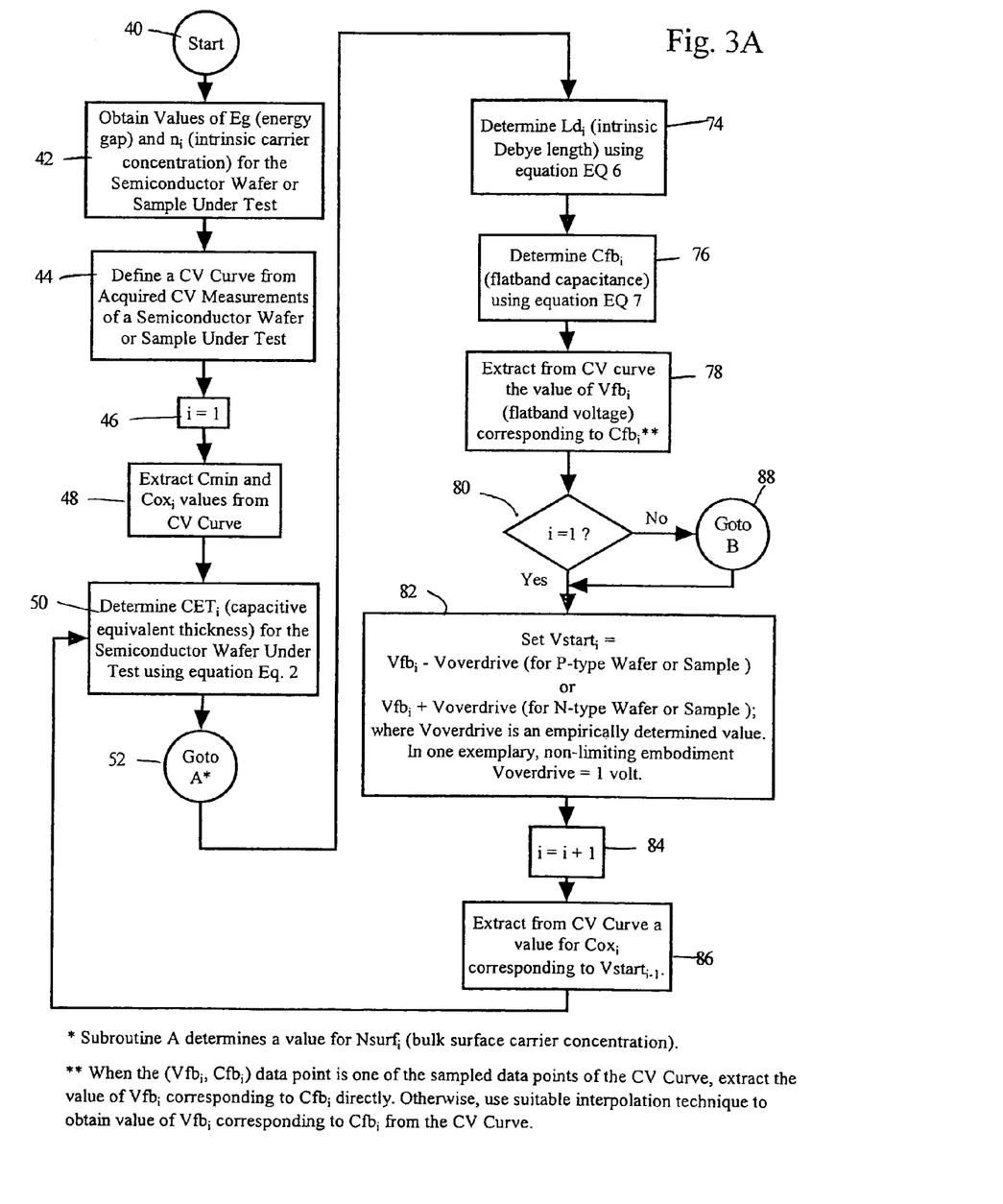
FIGS. 3A, 3B and 3C constitute a flowchart of a method for determining various electrical properties of a semiconductor wafer or sample utilizing the CV curve of FIG. 2.

In FIG. 3A, the method begins at start step 40 and advances to step 42 wherein values for energy gap (Eg) and intrinsic carrier concentration ($n_i$) for the semiconductor wafer or sample are obtained from standard tables of properties of semiconductors and insulators. Alternatively, the value of $n_i$ can be determined utilizing the empirical or theoretical form of the following equation EQ1:

EQ 1:

$$n_i = \sqrt{N_c N_v} * T^{\frac{3}{2}} * e^{-(Eg/2kT)} \text{(Theoretical)}$$

or $$n_i = G * T^{\frac{3}{2}} * e^{-(Eg0/kT)} \text{(Empirical)}.$$

where T=temperature in degrees Kelvin;
  $N_c$=Conduction band state density (obtained from a standard table of properties of semiconductors). For a Si wafer $N_c$=3.22×10$^{19}$ cm$^{-3}$;
  $N_v$=Valance band state density (obtained from standard table of properties of s semiconductors and insulators). For a Si wafer $N_v$=1.83×10$^{19}$ cm$^{-3}$;
  Eg=Energy gap (obtained from standard table of properties of semiconductors). For a Si wafer Eg=1.124 eV;
  $E_{g0}$=0.605 eV;
  G=Empirical constant=3.87×10$^{16}$; and
  k=Boltzmann's constant.

(Herein, the "*" symbol is the multiply sign).

Desirably, an operator of test system 2 can utilize a suitable human-machine interface (not shown) of test system 2 to select the standard table value of $n_i$, the theoretical value of $n_i$ (determined utilizing the theoretical form of equation EQ1) or the empirical value of $n_i$ (determined utilizing the empirical form of equation EQ1) for use hereinafter. Also or alternatively, test system 2 can be configured to utilize the standard table value of $n_i$, the theoretical value of $n_i$ or the empirical value of $n_i$ as a default value in the absence of the operator selection thereof or in the event test system 2 does not include any means for making such selection.

Details regarding the empirical form of equation EQ1 can be found in "Intrinsic Concentration, Effective Densities of States, and Effective Mass in Silicon," by Martin A. Green, J. Appl. Phys. 67(6), Mar. 15, 1990, pps 2944-2954, which is incorporated herein by reference.

One standard table of properties of semiconductors and insulators is found in "Device Electronics For Integrated Circuits," Copyright 1997, by John Wiley & Sons, Inc., Table 1.1, pps 32-33, which is also incorporated herein by reference. For the purpose of describing the present invention, it will be assumed hereinafter that each temperature dependent property of semiconductor wafer or sample 10 is obtained at 300° Kelvin. However, this is not to be construed as limiting the invention.

The method then advances to step 44 wherein CV curve 36 is derived or defined from CV measurements acquired from semiconductor wafer or sample 10 in response to the application of a CV-type electrical stimulus thereto. While CV curve 36 is illustrated in FIG. 2 as being continuous, in actuality, CV curve 36 resides in a memory (not shown) of measurement means 32 as a plurality of voltage-capacitance data points acquired by measurement means 32 during the application of the CV-type electrical stimulus to semiconductor wafer or sample 10 by the means for applying electrical stimulus 30.

The method then advances to step 46 wherein a variable i is set equal to one (1).

The method then advances to step 48 wherein a maximum capacitance ($Cox_i$) for the current value of i and a minimum capacitance (Cmin) of semiconductor wafer or sample 10 are obtained from CV curve 36, either directly from the data points comprising the CV curve 36 or via a suitable interpolation technique.

The method then advances to step 50 wherein a capacitive equivalent thickness value ($CET_i$) of semiconductor wafer or sample 10 is determined for the current value of i utilizing the following equation EQ2:

$$CET_i = ((k_{ox} * \epsilon_{ox} * A_{probe})/(Cox_i - \Delta C_{par})) - b_{CET} \qquad \text{EQ2:}$$

where $k_{ox}$=dielectric constant of dielectric layer 14;

$\epsilon_{ox}$=permittivity of dielectric layer 14;

$A_{probe}$=contact area of contact 6 in contact with top surface 22 of the semiconductor wafer or sample 10; (determined periodically, e.g., daily);

$Cox_i$=Cox for the current value of i;

$\Delta C_{par}$=parallel capacitance imparted to measurement by test system 2 (determined once); and $b_{CET}$=apparent thickness added to dielectric layer 14 by test system 2 (determined periodically, e.g., daily).

Values of $A_{probe}$ and $b_{CET}$ are determined periodically, e.g., daily, to account for changes in these constants that result over time from utilizing test system 2 to test semiconductor wafer or samples. In contrast, the value of $\Delta C_{par}$ is be determined once for test system 2 since it has been observed that such value remains substantially constant. The value of $\Delta C_{par}$ can be determined utilizing the procedure set forth in Section 10 of ASTM Standard F 1392-00, wherein $C_{comp}$ equals $\Delta C_{par}$ in equation EQ2 above. The determination of the values of $A_{probe}$ and $b_{CET}$ will be described in greater detail hereafter.

Figure 3B:
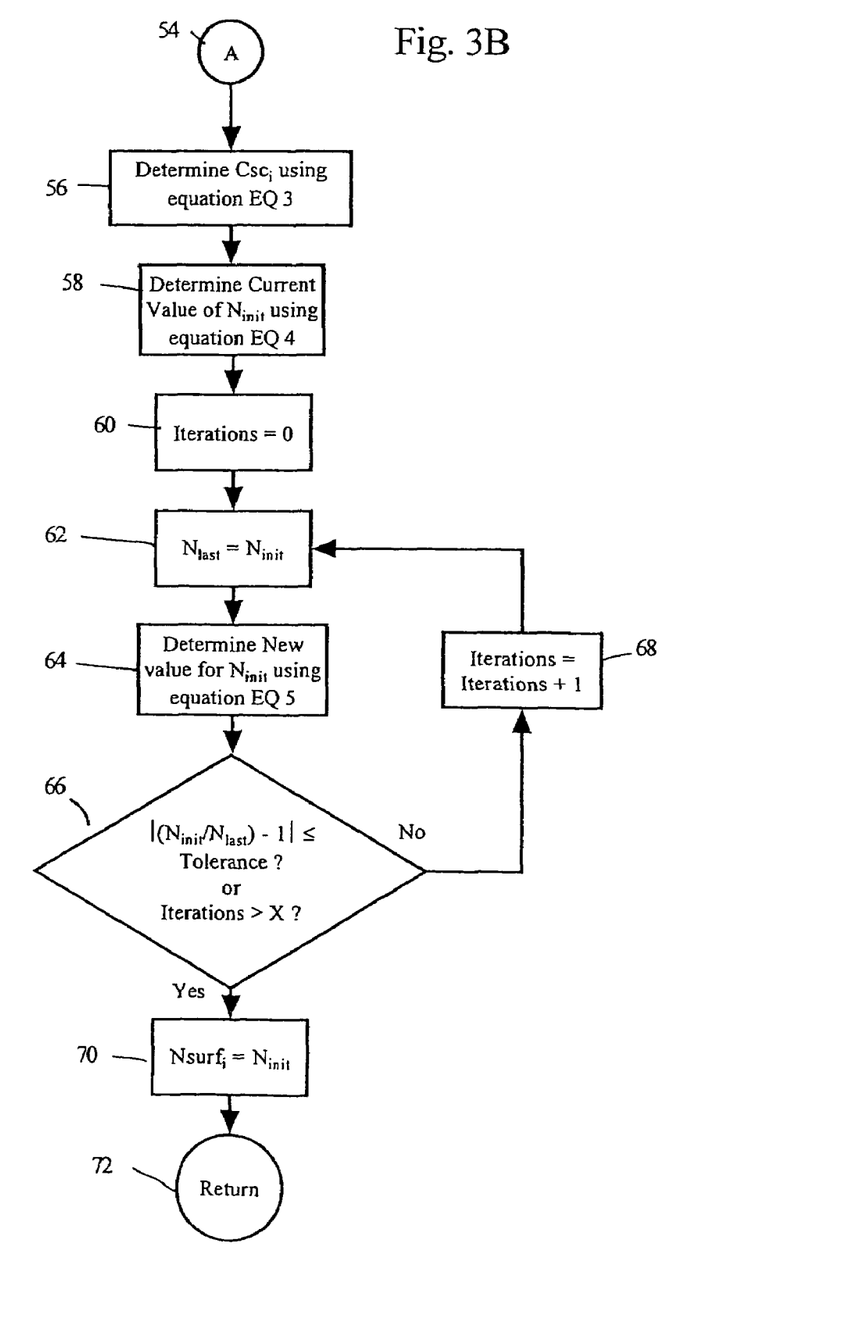

The method then advances to step 52 which calls a subroutine A shown in FIG. 3B.

Upon entry into subroutine A, the method advances from step 54 to step 56 wherein the capacitance ($Csc_i$) of the space charge region of semiconductor wafer or sample 10 in inversion is determined for the current value of i utilizing the following equation EQ3:

$$Csc_i = (Cmin * Cox_i)/(Cox_i - Cmin)/A_{probe} \qquad \text{EQ3:}$$

where $Cox_i$=Cox for the current value of i;

Cmin=Cmin capacitance value extracted from CV curve 36 in step 48; and $A_{probe}$=contact area of contact 6 in contact with top surface 22 of the semiconductor wafer or sample 10.

The method then advances to step 58 wherein a first estimated average surface doping concentration ($N_{init}$) of semiconductor wafer or sample 10 is determined utilizing the following equation EQ4:

$$N_{init} = \log(30.38759 + (1.68278 * \log(Csc_i)) - (0.03177 * (\log(Csc_i))^2)) \qquad \text{EQ4:}$$

where $Csc_i$ is obtained from the solution of equation EQ3 for the current value of i.

The method then advances to step 60 wherein the value of a variable "iterations" is set equal to zero.

The method then advances to step 62 wherein a variable $N_{last}$ is set equal to the current value of $N_{init}$.

The method then advances to step 64 wherein a new value for an estimated average surface doping concentration $N_{init}$ of semiconductor wafer or sample 10 is determined utilizing the following equation EQ5:

$$N_{init} = Csc_i^2 * k * T * 2 * (2 * |\log(N_{last}/n_i)| - 1 + \log(1.15 * |\log(N_{last}/n_i)| - 1))/(\epsilon_{wafer} * q) \qquad \text{EQ5:}$$

where $Csc_i^2$=square of the capacitance of $Csc_i$ obtained from the solution of equation EQ3 for the current value of i;

k=Boltzmann's constant;

T=temperature in degrees Kelvin;

$N_{last}$=prior value of $N_{init}$ established in Step 62 of subroutine A;

$n_i$=intrinsic carrier concentration of semiconductor wafer or sample 10 determined in step 42;

$\epsilon_{wafer}$=permittivity of semiconductor wafer or sample 10; and q=electron charge.

The method then advances to step 66 wherein the absolute value of $|N_{init}/N_{last}-1|$ is compared to a predetermined tolerance value (Tolerance ?) to determine if said absolute value is less than or equal to said predetermined tolerance value or if the value of the variable "iterations" is greater than a predetermined number X, e.g., 10. Provided neither of the conditions of step 66 is satisfied, the method advances to step 68 wherein the value of the variable "iterations" is increased by one (1). Thereafter, steps 62-66, and as necessary, step 68, are repeated until at least one of the conditions in step 66 is satisfied. Essentially, each iteration of the loop comprising steps 62-66 calculates a progressively more accurate value for the average surface doping concentration $N_{init}$ of semiconductor wafer or sample 10. When either condition in step 66 is satisfied, the method advances to step 70 wherein a value of a variable $Nsurf_i$ is set equal to the current value of $N_{init}$ for the current value of i. Thereafter, the method advances to step 72 for return to step 52 in the flowchart of FIG. 3A.

Upon return to step 52 from step 72, the method advances to step 74 wherein the intrinsic Debye length ($Ld_i$) of semiconductor wafer or sample 10 is determined utilizing the following equation EQ6:

EQ 6:

$$Ld_i = \sqrt{\frac{k * T * \varepsilon_{wafer}}{q^2 * Nsurf_i}}$$

where k=Boltzmann constant;
T=temperature in degrees Kelvin;
$\in_{wafer}$=permittivity of the semiconductor wafer or sample 10;
q=electron charge; and
Nsurf$_i$=from step 70 in subroutine A for the current value of i.

The method then advances to step 76 wherein current value of the flatband capacitance (Cfb$_i$) of semiconductor wafer or sample 10 is determined utilizing the following equation EQ7:

EQ 7:
$$Cfb_i = \frac{Cox_i * \varepsilon_{wafer}\left(\frac{A_{probe}}{Ld_i}\right)}{Cox_i + \varepsilon_{wafer}\left(\frac{A_{probe}}{Ld_i}\right)}.$$

where A$_{probe}$=contact area of contact 6 in contact with top surface 22 of the semiconductor wafer or sample 10 (measured periodically, e.g., daily);
Cox$_i$=Cox for the current value of i;
$\in_{wafer}$=permittivity of the semiconductor wafer or sample 10; and
Ld$_i$ is obtained from the solution of equation EQ6 for the current value of i.

The method then advances to step 78 wherein flatband voltage Vfb$_i$ corresponding to Cfb$_i$ determined utilizing equation EQ7 is extracted from CV curve 36. Where CV curve 36 resides as a plurality of discrete voltage-capacitance data points in the memory of measurement means 32, when the (Vfb$_i$, Cfb$_i$) data point is one of the sampled data points, the value of Vfb$_i$ corresponding to Cfb$_i$ is extracted directly from said data point. However, if the (Vfb$_i$, Cfb$_i$) data point is not one of the sampled data points, a suitable interpolation technique can be utilized to determine the value of Vfb$_i$ corresponding to Cfb$_i$.

The method then advances to step 80 wherein it is determined whether the value of i equals one (1). If so, the method advances to step 82.

In step 82, a voltage Vstart$_i$ for the current value of i is determined from the value of Vfb$_i$ determined in step 78 and the value of an empirically predetermined, so-called overdrive voltage Voverdrive. The value of Voverdrive is empirically determined to assist in the convergence of Vfb, discussed hereinafter in connection with step 92. In one exemplary, non-limiting embodiment, Voverdrive equals one (1) volt. However, this is not to be construed as limiting the invention since any suitable, empirically determined value of Voverdrive that aids in the convergence of Vfb$_i$ can be utilized.

As shown in step 82, the value of Vstart$_i$ is determined by subtracting the value of Voverdrive from the current value of Vfb$_i$ for a p-type wafer or adding the value of Voverdrive to the current value of Vfb$_i$ for an n-type wafer.

As shown in FIG. 2 for a p-type semiconductor wafer or sample, subtracting the current value of Voverdrive from the current value of Vfb$_i$ results in Vstart$_i$ having a value that is desirably on or adjacent a voltage where the maximum capacitance (Cox) of CV curve 36 occurs. As would be appreciated by one skilled in the art, since a CV curve for an n-type semiconductor wafer or sample is the mirror image of CV curve 36 shown in FIG. 2, the addition of Voverdrive to the current value of Vfb$_i$ for an n-type semiconductor wafer or sample results in the current value of Vstart$_i$ having a value on or adjacent where the maximum capacitance (Cox) of the CV curve (not shown) for the n-type semiconductor wafer or sample occurs.

The method then advances to step 84 wherein the value of i is incremented by one (1). In step 86, a new maximum capacitance value Cox$_i$ corresponding to the value of Vstart$_{i-1}$ is obtained from CV curve 36, for the current value of i.

In step 86, when the value of Vstart$_{i-1}$ equals the voltage value of one of the sampled voltage-capacitance data points comprising CV curve 36, the value of Cox$_i$ equals the capacitance value of said data point and can be extracted directly from said data point. Otherwise, a suitable interpolation technique can be utilized to obtain from CV curve 36 the capacitance value that equals the value of Cox$_i$ when the value of Vstart$_{i-1}$ does not equal the voltage value of one of the sampled voltage-capacitance data points.

From step 86, the method returns to step 50 whereupon steps 50-78 are repeated to determine new values of CET$_i$, Nsurf$_i$, Ld$_i$, Cfb$_i$ and Vfb$_i$ for the current value of i. After completing step 78, the method advances to step 80. Since, in this iteration of step 80, i is not equal to 1, the method advances to step 88 which calls a subroutine B shown in FIG. 3C.

Figure 3C:
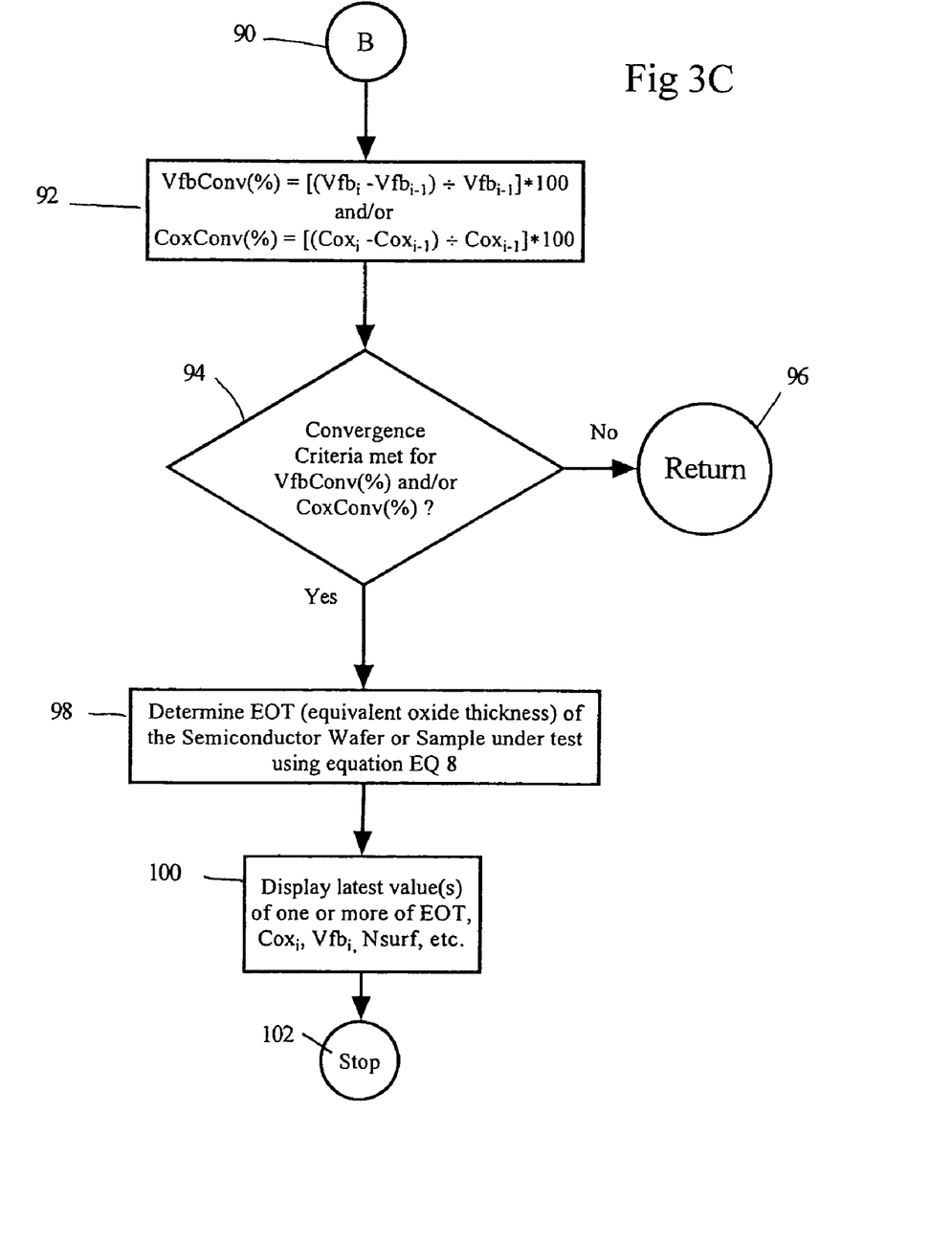

Upon entering subroutine B, the method advances from step 90 to step 92 wherein one or both of a flatband voltage convergence criteria VfbConv(%) and/or a maximum capacitance convergence criteria CoxConv(%) is determined utilizing the equations shown in step 92 or any other suitable and desirable convergence criteria.

The method then advances to step 94 wherein a determination is made whether a predetermined convergence criteria for VfbConv(%) and/or a predetermined convergence criteria for CoxConv(%) has been satisfied.

As shown in step 94, the decision to advance to step 96 or 98 from step 94 depends on whether the predetermined convergence criteria for VfbConv(%) and/or the predetermined convergence criteria for CoxConv(%) has been satisfied. If neither convergence criteria has been satisfied, the method advances to step 96 for return to step 88 in FIG. 3A. Each time the method returns to step 88, steps 82-86 and 50-80 are repeated in the manner discussed above to determine new values of CET$_i$, Nsurf$_i$, Ld$_i$, Cbf$_i$ and Vfb$_i$ for the current value of i, which is incremented in each iteration of step 84. Thereafter, since the value of i will always be greater than 1, the method will always advance to step 88 and, hence, subroutine B from step 80.

If, in any iteration of step 94, the convergence criteria is satisfied for one or both of VfbConv(%) and/or CoxConv (%) the corresponding value of Vfb$_i$ and/or Cox$_i$ is deemed to be the actual value(s) for semiconductor wafer or sample 10.

The method then advances to step 98 wherein the equivalent oxide thickness (EOT) of semiconductor wafer or sample 10 is determined utilizing the following equation EQ8:

$$EOT=CET_i-[a_1-(2a_2)Fox] \qquad \text{EQ8:}$$

where CET$_i$ is obtained from the solution of equation EQ2 in step 50 for the current value of i;

$$Fox = \frac{Voverdrive}{CET_i};$$

and for a silicon wafer or sample having a <100> orientation, at 300° K:

$a_1 = 7.4 \times 10^{-8}$ cm and $a_2 = -4.3 \times 10^{-15}$ cm$^2$/V when Fox<6; and $a_1 = 3.79 \times 10^{-8}$ cm and $a_2 = -5.19 \times 10^{-16}$ cm$^2$/V when Fox>6.

or for a silicon wafer or sample having a <111> orientation, at 300° K:

$a_1 = 8.87 \times 10^{-8}$ cm and $a_2 = -5.2 \times 10^{-15}$ cm$^2$/V when Fox<6; and $a_1 = 4.46 \times 10^{-8}$ cm and $a_2 = -6.85 \times 10^{-16}$ cm$^2$/V when Fox>6.

Details regarding the determination of the values of $a_1$ and $a_2$ can be found in the publication Quantum-Mechanical Modeling of Accumulation Layers in MOS Structure by Suñé et al., IEEE Transactions On Electron Devices, Vol. 39, No. 7, July 1992. However, the citation of the Suñé et al. article is not to be construed as limiting the invention since any other suitable Quantum-Mechanical Modeling method can be utilized for determining suitable values of $a_1$ and $a_2$.

The method then advances to step 100 wherein one or more of the current values of EOT, CET$_i$, Nsurf$_i$, Ld$_i$, Cfb$_i$, Vfb$_i$, Cox$_i$, and the like for semiconductor wafer or sample 10 are displayed on display 34 or any other suitable output means under the control of measurement means 32. Lastly, the method advances to Stop step 102 wherein the method terminates.

As can be seen, the present invention is a method and apparatus for recursively determining accurate values of various properties of a semiconductor wafer or sample under test based upon the use of a single CV curve. The method enables values of various properties of the semiconductor wafer or sample under test to be accurately determined within acceptable tolerances more quickly than the prior art heuristic technique and with minimal operator intervention.

Figure 4:
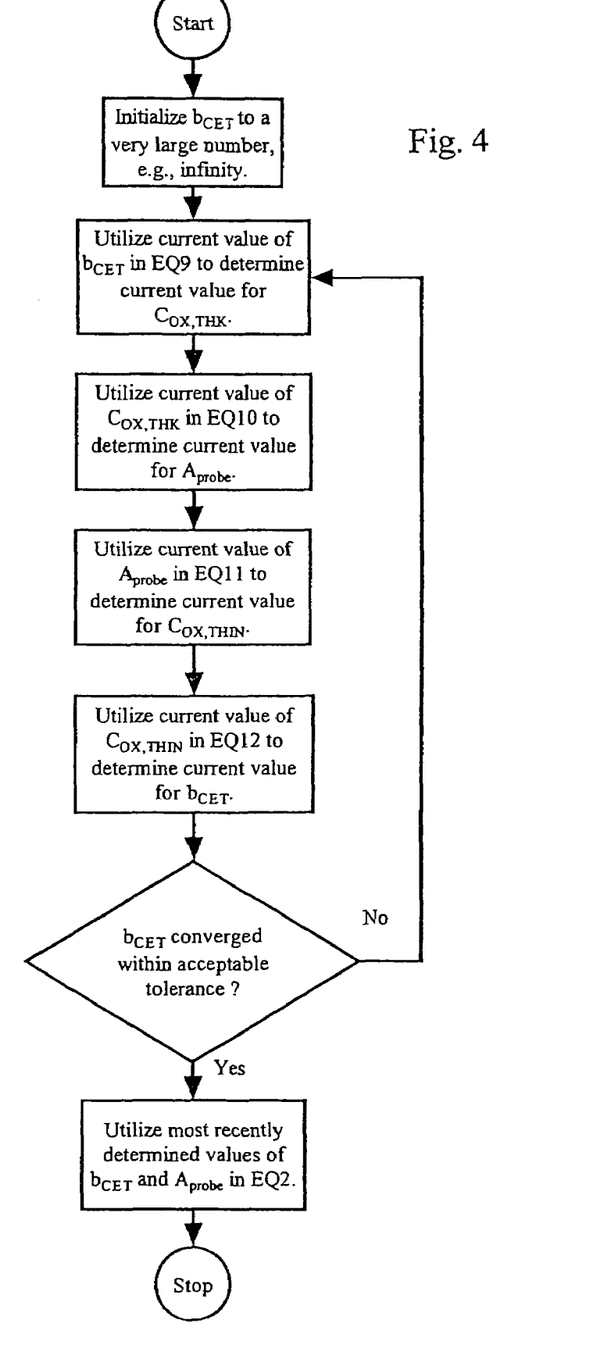
FIG. 4 is a flowchart of a method for determining values of $A_{probe}$ and $b_{CET}$ of the semiconductor wafer or sample for use in determining various other electrical properties of the semiconductor wafer or sample.

A method for determining the values of $A_{probe}$ and $b_{CET}$ that are used in one or more of the foregoing equations will now be described with reference to FIG. 4 and the following equations EQ9-EQ12.

$$C_{OX,THK} = 1/[(1/(C_{m,THK} - C_{PAR,THK})) - (1/b_{CET})] \qquad \text{EQ9:}$$

$$A_{probe} = C_{OX,THK}(T_{OX,THK} + \Delta T_{OX,QM})/(\epsilon k_{OX}) \qquad \text{EQ10:}$$

$$C_{OX,THIN} = \epsilon k_{OX} A_{probe}/(T_{OX,THIN} + \Delta T_{OX,QM}) \qquad \text{EQ11:}$$

$$b_{CET} = 1/[(1/(C_{m,THIN} - C_{PAR,THIN})) - (1/C_{OX,THIN})] \qquad \text{EQ12:}$$

The determination of values of $A_{probe}$ and $b_{CET}$ entails the use of two test semiconductor wafer or samples, the first of which has a "thick" dielectric layer 14 and the second of which has a "thin" dielectric layer 14. Desirably, the "thin" dielectric layer has a thickness between 10-50 Angstroms while the "thick" dielectric layer has a thickness between 100-300 Angstroms.

Generally, equations EQ9-EQ12 are solved iteratively or recursively until the value of $b_{CET}$ converges to within an acceptable tolerance, e.g., <0.01%. Equations EQ9-EQ10 are utilized with the semiconductor wafer or sample having the thick dielectric layer while equations EQ11-EQ12 are utilized with the semiconductor wafer or sample having the thin dielectric layer.

For the initial solution of EQ9, $b_{CET}$ is initialized to a very large number, e.g., infinity ($\infty$), whereupon the value of $1/b_{CET}$ is, for all practical purposes, essentially zero (0). The value of $C_{PAR,THK}$ of the semiconductor wafer or sample having the thick dielectric layer is determined utilizing the procedure set forth in Section 10, of ASTM Standard F 1392-00, wherein $C_{comp}$ equals $C_{PAR,THK}$ in EQ9. The value of $C_{m,THK}$ is determined from a CV curve derived or defined from CV measurements of the semiconductor wafer or sample 10 having the thick dielectric layer. More specifically, the maximum capacitance of the CV curve derived or defined from semiconductor wafer or sample having the thick dielectric layer is deemed to be the value of $C_{m,THK}$ in EQ9. The thus determined values of $C_{PAR,THK}$ and $C_{m,THK}$ for the semiconductor wafer or sample having the thick dielectric layer are constants that are utilized in each iteration of equation EQ9 hereinafter to determine a corresponding current value $C_{OX,THK}$.

The current value of $C_{OX,THK}$ determined from the immediately preceding solution of EQ9 is utilized in equation EQ10 to determine the current value of $A_{probe}$. In equation EQ10, the value of $T_{OX,THK}$, i.e., the thickness of the thick dielectric layer, can be determined in any suitable and desirable manner know in the art, e.g., ellipsometry. $\Delta T_{OX,QM}$ in equation EQ10 relates to the quantum-mechanical thickness of the thick dielectric layer. The value of $\Delta T_{OX,QM}$ can be determined either empirically or numerically utilizing any suitable and desirable numerical technique know in the art. The Suñé et al. reference, discussed above, discloses one method for numerically determining the value of $\Delta T_{OX,QM}$, wherein $t_{ox}$ in equation (15) of the Suñé et al. reference corresponds to $\Delta T_{OX,QM}$ herein. It has been observed that an empirically determined value of 3 Angstroms for $\Delta T_{OX,QM}$ in equation EQ10 results in the value of $A_{probe}$ being within an acceptable tolerance. In equation EQ10, the actual values for $\epsilon$ (permittivity) and $k_{OX}$ (dielectric constant) for the thick dielectric layer can be obtained from standard tables. The thus determined or obtained values of $T_{OX,THK}$, $\Delta T_{OX,QM}$, $\epsilon$ and $k_{OX}$ are constants that are utilized in each iteration of equation EQ10 hereinafter to determine a corresponding current value for $A_{probe}$.

The current value of $A_{probe}$ determined from the immediately preceding solution of equation EQ10 is utilized in equation EQ11 to determine the current value of $C_{OX,THIN}$. In equation EQ11, the value of $T_{OX,THIN}$, i.e., the thickness of the thin dielectric layer, can be determined in any suitable and desirable manner know in the art, e.g., ellipsometry. The thus determined or obtained value of $T_{OX,THIN}$ is a constant for the semiconductor wafer or sample having the thin dielectric layer. The values of constants $\Delta T_{OX,QM}$, $\epsilon$ and $k_{OX}$ in equation EQ11 are the same as the corresponding values in equation EQ10, discussed above. The values of constants $T_{OX,THIN}$, $\Delta T_{OX,QM}$, $\epsilon$ and $k_{OX}$ are utilized in each iteration of equation EQ11 hereinafter to determine a corresponding current value for $C_{OX,THIN}$.

The current value of $C_{OX,THIN}$ determined from the immediately preceding solution of equation EQ11 is utilized in equation EQ12 to determine the current value of $b_{CET}$. In equation EQ12, the value of $C_{PAR,THIN}$ of the semiconductor wafer or sample having the thin dielectric layer is determined utilizing procedure set forth in Section 10 of ASTM Standard F1392-00, wherein $C_{comp}$ equals $C_{PAR,THIN}$ in EQ12. The value of $C_{m,THIN}$ is determined from a CV curve derived or defined from CV measurements of the semiconductor wafer or sample 10 having the thin dielectric layer. More specifically, the maximum capacitance of the CV curve derived or defined from the semiconductor wafer or sample having the thin dielectric layer is deemed to be the value of $C_{m,THIN}$ in EQ12. The thus determined values of $C_{PAR,THIN}$ and $C_{m,THIN}$ for the semiconductor wafer or sample having the thin dielectric layer are constants that are utilized in each iteration of equation EQ12 hereinafter to determine an updated value for $b_{CET}$.

The updated value of $b_{CET}$ determined from the immediately preceding solution of equation EQ12 is substituted for the immediately preceding value of $b_{CET}$ used in equation EQ9, which is then solved to obtain an updated value for $C_{OX,THK}$. The thus determined updated value of $C_{OX,THK}$ is then substituted for the immediately preceding value of $C_{OX,THK}$ in equation EQ10 which is then solved to obtain an updated value for $A_{probe}$. The thus determined updated value of $A_{probe}$ is then substituted for the immediately preceding value of $A_{probe}$ in equation EQ11 which is then solved to obtain an updated value for $C_{OX,THIN}$. The thus determined updated value of $C_{OX,THIN}$ is then substituted for the immediately preceding value of $C_{OX,THIN}$ in equation EQ12 which is then solved to obtain an updated value for $b_{CET}$.

The updated value of $b_{CET}$ and the immediately preceding value of $b_{CET}$ are then compared to determine if $b_{CET}$ has converged to within an acceptable tolerance. If not, the procedure disclosed in the immediately preceding paragraph for determining updated values for $C_{OX,THK}$, $A_{probe}$, $C_{OX,THIN}$ and $b_{CET}$, based on the value of $b_{CET}$ determined from the immediately preceding solution of equation EQ12, is repeated until $b_{CET}$ has converged to within the acceptable tolerance, whereupon the most recently determined values of $A_{probe}$ and/or $b_{CET}$ are utilized in equations EQ2, EQ3 and EQ7 to determine values of $CET_i$, $Csc_i$, and $Cfb_i$ for the current value of i.

The invention has been described with reference to the preferred embodiment. Obvious modifications and alterations will occur to others upon reading and understanding the preceding detailed description. It is intended that the invention be construed as including all such modifications and alterations insofar as they come within the scope of the appended claims or the equivalents thereof.

The invention claimed is:

1. A method of determining one or more electrical properties of a semiconductor wafer or sample, said method comprising:
    (a) applying a CV-type electrical stimulus to a semiconductor wafer or sample having a dielectric layer overlaying a substrate of semiconducting material;
    (b) measuring a response of the semiconductor wafer or sample to the CV-type stimulus;
    (c) setting i=1;
    (d) determining from the measured response in step (b) a maximum capacitance $Cox_i$ of the semiconductor wafer or sample and a minimum capacitance Cmin of the semiconductor wafer or sample;
    (e) determining a flatband capacitance $Cfb_i$ of the semiconductor wafer or sample as a function of $Cox_i$ and Cmin;
    (f) utilizing the measured response in step (b) to determine for $Cfb_i$ a corresponding flatband voltage $Vfb_i$ of the semiconductor wafer or sample;
    (g) combining $Vfb_i$ and a predetermined overdrive voltage Voverdrive to obtain a starting voltage value Vstart;
    (h) setting i=i+1;
    (i) determining from the measured response in step (b) a maximum capacitance $Cox_i$ of the semiconductor wafer or sample corresponding to the value of Vstart; and
    (j) repeating steps (e)-(i) until:
        (1) a predetermined capacitance convergence criteria for $Cox_i$ and $Cox_{i-1}$ is satisfied; and/or
        (2) a predetermined flatband voltage convergence criteria for $Vfb_i$ and $Vfb_{i-1}$ is satisfied.

2. The method of claim 1, further including:
    determining for each value of i a capacitive equivalent thickness $CET_i$ of the semiconductor wafer or sample as a function of $Cox_i$; and
    when at least one of the predetermined capacitance convergence criteria or the predetermined flatband voltage convergence criteria is satisfied, determining an equivalent oxide thickness EOT of the semiconductor wafer or sample as a function of Voverdrive and $CET_i$ for the current value of i.

3. The method of claim 2, further including outputting one or more of $Cox_i$, $Vfb_i$, $CET_i$ and EOT in a human perceivable manner.

4. The method of claim 1, wherein the predetermined capacitance convergence criteria is:

$\{[(Cox_i - Cox_{i-1}) \div Cox_{i-1}]*100\} \le x$ %.

5. The method of claim 4, wherein x %=1%.

6. The method of claim 1, wherein the predetermined flatband voltage convergence criteria is:

$\{[(Vfb2 - Vfb1) \div Vfb1]*100\} \le x$ %.

7. The method of claim 6, wherein x %=1%.

8. A method of determining one or more electrical properties of a semiconductor wafer or sample, said method comprising:
    (a) applying a CV-type stimulus to a semiconductor wafer or sample comprised of a substrate of semiconducting material having an overlaying dielectric layer;
    (b) measuring a response of the semiconductor wafer or sample to the CV-type stimulus;
    (c) determining a maximum capacitance value Cox1 of the semiconductor wafer or sample and a minimum capacitance value Cmin of the semiconductor wafer or sample from the measured response in step (b);
    (d) determining a flatband capacitance value Cfb1 of the semiconductor wafer or sample as a function of Cox1 and Cmin;
    (e) utilizing the measured response in step (b) to determine for Cfb1 a corresponding flatband voltage value Cfb1 of the semiconductor wafer or sample;
    (f) combining Cfb1 and a predetermined overdrive voltage value Voverdrive to obtain a starting voltage value Vstart;
    (g) utilizing the value of Vstart to determine a maximum capacitance value Cox2 of the semiconductor wafer or sample from the measured response in step (b);
    (h) determining a flatband capacitance value Cfb2 of the semiconductor wafer or sample as a function of Cox2 and Cmin;
    (i) utilizing the measured response in step (b) to determine for Cfb2 a corresponding flatband voltage value Cfb2 of the semiconductor wafer or sample; and
    (j) determining an equivalent oxide thickness (EOT) of the semiconductor wafer or sample when at least one of:
        (1) a predetermined capacitance convergence criteria for Cox1 and Cox2 is satisfied; and/or
        (2) a predetermined flatband voltage convergence criteria for Cfb1 and Cfb2 is satisfied.

9. The method of claim 8, further including:
    determining a capacitive equivalent thickness CET of the semiconductor wafer or sample as a function of Cox1 or Cox2; and determining EOT in step (j) as a function of CET and Voverdrive.

10. The method of claim 9, further including outputting at least one of CET or EOT in a human perceivable manner.

11. A method of determining one or more electrical properties of a semiconductor wafer or sample, said method comprising:
- (a) applying a CV-type stimulus to a semiconductor wafer or sample comprised of a substrate of semiconducting material having an overlaying dielectric layer;
- (b) measuring a response of the semiconductor wafer or sample to the CV-type stimulus;
- (c) setting i=1;
- (d) determining from the measured response in step (b) a maximum capacitance $Cox_i$ of the semiconductor wafer or sample and a minimum capacitance Cmin of the semiconductor wafer or sample;
- (e) determining a flatband capacitance $Cfb_i$ of the semiconductor wafer or sample as a function of $Cox_i$;
- (f) obtaining from the measured response in step (b) a flatband voltage $Vfb_i$ of the semiconductor wafer or sample corresponding to $Cfb_i$;
- (g) combining a predetermined voltage Voverdrive and $Vfb_i$ to obtain a starting voltage value Vstart;
- (h) obtaining from the measured response in step (b) a maximum capacitance $Cox_{i+1}$ of the semiconductor wafer or sample corresponding to the current value of Vstart;
- (i) determining a flatband capacitance $Cfb_{i+1}$ of the semiconductor wafer or sample as a function of $Cox_{i+1}$;
- (j) obtaining from the measured response in step (b) a flatband voltage value $Vfb_{i+1}$ of the semiconductor wafer or sample corresponding to $Cfb_{i+1}$; and
- (k) when a predetermined convergence criteria for at least one of (1) $Vfb_i$ and $Vfb_{i+1}$ or (2) $Cox_i$ and $Cox_{i+1}$ is satisfied, determining an equivalent oxide thickness (EOT) of the semiconductor wafer or sample, otherwise, setting i=i+1 and repeating steps (g)-(k).

12. The method of claim 11, wherein, at least one of:
the predetermined convergence criteria for $Vfb_{i+1}$ and $Vfb_i$ is $$\{[(Vfb_{i+1} - Vfb_i) \div Vfb_i] * 100\} \leq x \%; \text{ and/or}$$

the predetermined convergence criteria for $Cox_i$ and $Cox_{i+1}$ is $$\{[(Cox_{i+1} - Cox_i) \div Cox_i] * 100\} \leq x \%.$$

13. The method of claim 12, wherein x %=1%.

14. The method of claim 11, further including:
- determining as a function of each value of Cox corresponding values of (1) capacitive oxide thickness (CET) of the semiconductor wafer or sample and (2) capacitance of a space charge region (Csc) of the semiconductor wafer or sample in inversion;
- determining as a function of each value of Csc a corresponding value of bulk surface carrier concentration (Nsurf) of the semiconductor wafer or sample; and
- determining as a function of each value of Nsurf a corresponding value of intrinsic Debye length (Ld) of the semiconductor wafer or sample.

15. The method of claim 14, wherein each value of flatband capacitance Cfb is also determined as a function of the corresponding value of Ld.

16. The method of claim 14, wherein, in step (k), EOT is determined as a function of the value of Voverdrive and the latest value of CET.

* * * * *

UNITED STATES PATENT AND TRADEMARK OFFICE
CERTIFICATE OF CORRECTION

| | | |
|---|---|---|
| PATENT NO. | : 7,295,022 B2 | Page 1 of 1 |
| APPLICATION NO. | : 11/216505 | |
| DATED | : November 13, 2007 | |
| INVENTOR(S) | : Jong-Bok Park et al. | |

It is certified that error appears in the above-identified patent and that said Letters Patent is hereby corrected as shown below:

Column 14, Line 43, Claim 8, "Cfb1 of the semiconductor" should read -- Vfb1 of the semiconductor --

Column 14, Line 44, Claim 8, "Cfb1 and a predetermined" should read -- Vfb1 and a predetermined --

Column 14, Line 55, Claim 8, "voltage value Cfb2" should read -- voltage value Vfb1 --

Column 14, Line 63, Claim 8, "criteria for Cfb1 and Cfb2" should read -- criteria for Vfb1 and Vfb2 --

Signed and Sealed this

Thirteenth Day of May, 2008

JON W. DUDAS
*Director of the United States Patent and Trademark Office*